US011251797B2

(12) United States Patent
Etou et al.

(10) Patent No.: US 11,251,797 B2
(45) Date of Patent: Feb. 15, 2022

(54) TIME-TO-DIGITAL CONVERTER AND PHASE LOCKED LOOP

(71) Applicant: SONY SEMICONDUCTOR SOLUTIONS CORPORATION, Kanagawa (JP)

(72) Inventors: Shinichirou Etou, Kanagawa (JP); Tetsuya Fujiwara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/961,383

(22) PCT Filed: Oct. 15, 2018

(86) PCT No.: PCT/JP2018/038313
§ 371 (c)(1),
(2) Date: Jul. 10, 2020

(87) PCT Pub. No.: WO2019/146177
PCT Pub. Date: Aug. 1, 2019

(65) Prior Publication Data
US 2020/0366298 A1 Nov. 19, 2020

(30) Foreign Application Priority Data
Jan. 25, 2018 (JP) .............................. JP2018-010300

(51) Int. Cl.
*H03L 7/089* (2006.01)
*H03L 7/099* (2006.01)

(52) U.S. Cl.
CPC .......... *H03L 7/0895* (2013.01); *H03L 7/0992* (2013.01); *H03L 2207/50* (2013.01)

(58) Field of Classification Search
CPC ..... H03L 7/0895; H03L 7/089; H03L 7/0891; H03L 7/0893; H03L 7/0896; H03L 7/0898; H03L 7/091; H03L 7/0992
See application file for complete search history.

(56) References Cited

U.S. PATENT DOCUMENTS 10,191,453 B2 * 1/2019 Pavlovic ................. H03M 1/38
2016/0373120 A1 12/2016 Caffee et al.
2017/0194972 A1 7/2017 Sai et al.

FOREIGN PATENT DOCUMENTS

JP 2014-207569 A 10/2014
WO 2016/104464 A1 6/2016

OTHER PUBLICATIONS

Sai, et al., "19.7 A 65nm CMOS ADPLL with 360μW 1.6ps-INL SS-ADC-Based Period-Detection-Free TDC", Session 19, IEEE, International Solid-State Circuits Conference, Feb. 3, 2016, pp. 336-337.

(Continued)

*Primary Examiner* — Hai L Nguyen
(74) *Attorney, Agent, or Firm* — Chip Law Group

(57) ABSTRACT

Power consumption of a time-to-digital converter (TDC) used in a phase locked loop (ADPLL) is suppressed. The time-to-digital converter includes an analog-to-digital converter and a current source circuit. The analog-to-digital converter includes a predetermined charge capacitor. The current source circuit supplies a charge current that charges the charge capacitor of the analog-to-digital converter with a charge. The charge current supplied by the current source circuit is supplied so that a charge voltage at the time of charging the charge capacitor of the analog-to-digital converter with the charge current has a constant gradient with respect to a charge time.

7 Claims, 9 Drawing Sheets

(56) References Cited

OTHER PUBLICATIONS

International Search Report and Written Opinion of PCT Application No. PCT/JP2018/038313, dated Dec. 4, 2018, 07 pages of ISRWO.

* cited by examiner

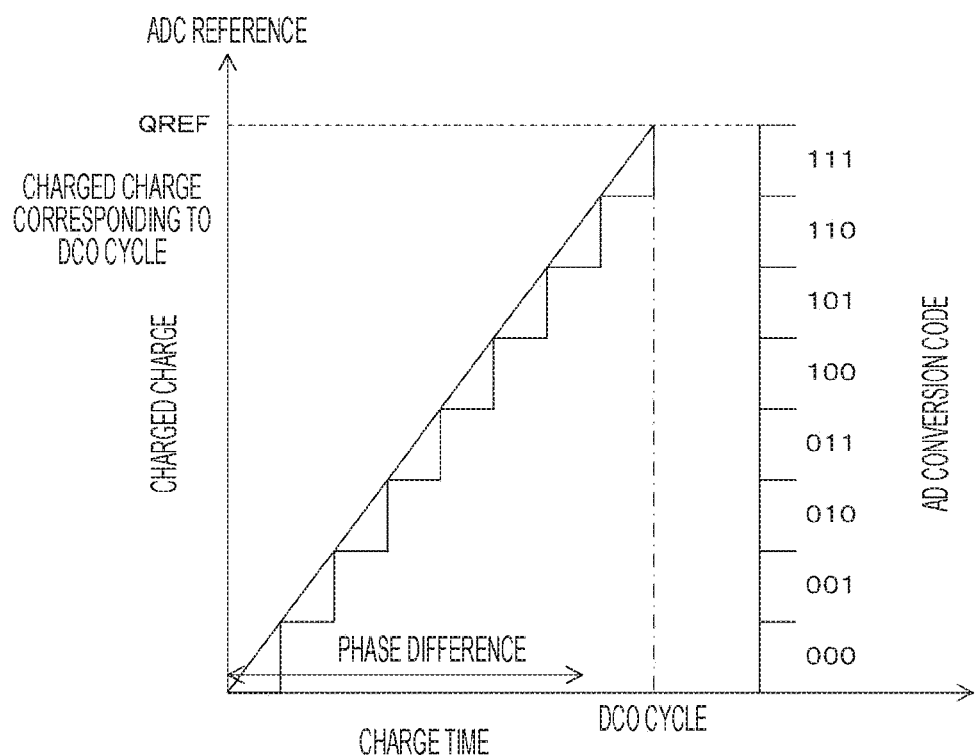
FIG. 5A
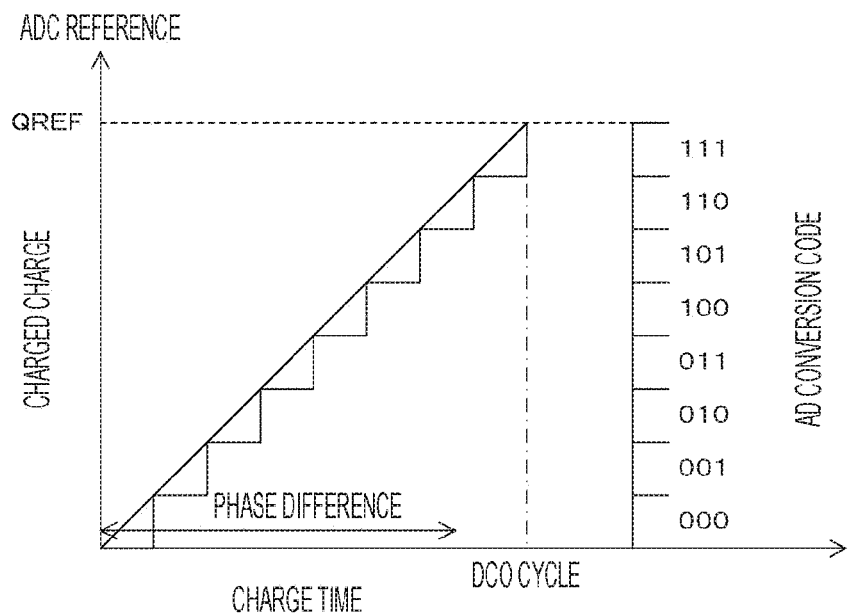
FIG. 5B (CASE OF SMALL CURRENT OR LARGE CAPACITANCE)

TIME-TO-DIGITAL CONVERTER AND PHASE LOCKED LOOP

CROSS REFERENCE TO RELATED APPLICATIONS

This application is a U.S. National Phase of International Patent Application No. PCT/JP2018/038313 filed on Oct. 15, 2018, which claims priority benefit of Japanese Patent Application No. JP 2018-010300 filed in the Japan Patent Office on Jan. 25, 2018. Each of the above-referenced applications is hereby incorporated herein by reference in its entirety.

TECHNICAL FIELD

The present technology relates to a time-to-digital converter. More specifically, the present technology relates to a time-to-digital converter and a phase locked loop including the time-to-digital converter.

BACKGROUND ART

In recent years, reduction in power consumption of LSIs has been required for the coming IoT era. Local oscillators account for a large portion of power consumption of analog blocks mounted on LSIs. A local oscillator includes a phase locked loop (PLL), and a digitized all-digital-PLL (ADPLL) has been recently used in particular. The ADPLL generates a DCO frequency Fdco from a digital frequency command word (FCW) and an external reference frequency Fref so as to satisfy a relationship of Fdco=FCW×Fref. In order to adjust a ratio of Fdco to Fref to FCW, the ADPLL includes a counter circuit that detects an integral phase difference between Fdco and Fref and a time-to-digital converter (TDC) that detects a fractional phase difference.

A conventional ADPLL detects a phase difference by delaying Fdco in several inverter circuits and detecting a rising edge of Fref in a latch circuit. This configuration is simple, but a large number of inverter circuits need to operate in order to generate a delay when the phase difference between Fref and Fdco is large, which increases current consumption. Thus, this configuration cannot operate with sufficiently low power. Further, an amount of delay greatly fluctuates depending on an influence of process/voltage/temperature (PVT) variation, and thus a correction circuit is required in many cases. Furthermore, in order to support a wide range of reference frequencies Fref, it is necessary to excessively decrease (or increase) the amount of delay of the inverter circuits. This results in mounting an excessive number of inverter circuits.

Therefore, a TDC including a single-slope ADC (SS-ADC) is conventionally proposed (e.g., see Non-Patent Document 1). In this related art, a phase difference signal PF between Fref and Fdco is generated by a phase detector, and a capacitor C1 is charged with a current from a charge pump for a time period of PF to obtain VF. Then, a capacitor C2 (C1: C2=1: N (N or more but 2)) is charged with a current from the charge pump to generate VRAMP, and the number of pulses of Fdco until VF and VRAMP intersect is counted (the number of counts: n (n or more but 1)). The capacitors C1 and C2 are "1: N", and slope of VF and VRAMP is "N: 1". Thus, n/N is an AD conversion value and corresponds to the fractional phase difference between Fref and Fdco.

CITATION LIST

Non-Patent Document

Non-Patent Document 1: Akihide Sai, et. al: "A 65 nm CMOS ADPLL with 360 µW 1.6 ps-INL SS-ADC-based period-detection-free TDC," 19.7, ISSCC (International Solid-State Circuits Conference), IEEE (2016)

SUMMARY OF THE INVENTION

Problems to be Solved by the Invention

In the above related art, the TDC includes the SS-ADC. However, in the above related art, when the phase difference between Fref and Fdco is large, it is necessary to continue to operate the CP for several clocks of Fdco until VF and VRAMP are obtained. Therefore, an intermittent rate in one cycle of Fref is lowered, and sufficient reduction in power becomes difficult. Further, if a charge current fluctuates due to fluctuation of a process, linearity of a CP circuit may be significantly degraded. In this case, correction is required.

The present technology has been made in view of such circumstances, and an object thereof is to suppress power consumption of a time-to-digital converter (TDC) used in a phase locked loop (ADPLL).

Solutions to Problems

The present technology has been made to solve the above problems, and a first aspect of the present technology is a time-to-digital converter and a phase locked loop including the time-to-digital converter, the time-to-digital converter including: an analog-to-digital converter including a predetermined charge capacitor; and a current source circuit configured to supply a charge current that charges the charge capacitor with a charge, in which a charge voltage of the charge capacitor has a constant gradient with respect to a charge time. This makes it possible to suppress an influence of PVT variation, eliminate the need for calibration of a charge pump, and suppress power consumption.

Further, in the first aspect, the current source circuit may supply the charge current by using a resistance of a switched capacitor as a reference resistance, and the charge current may be proportional to a capacitor and a switching frequency of the switched capacitor. This makes it possible to suppress the influence of the PVT variation in the switched capacitor and eliminate the need for calibration of the charge pump.

Further, in the first aspect, the charge voltage may be proportional to a ratio of the charge capacitor to the capacitor of the switched capacitor. This makes it possible to suppress the influence of the PVT variation on the charge voltage.

Further, in the first aspect, the current source circuit may match the switching frequency of the switched capacitor with one cycle of phase detection. This makes it possible to keep a dynamic range of the time-to-digital converter constant.

Further, in the first aspect, the analog-to-digital converter may include, as the charge capacitor, a first capacitor configured to hold phase information and a second capacitor configured to hold cycle information. This makes it possible to generate digital values on the basis of charges held in the first and second capacitors.

Further, in the first aspect, the first capacitor may be configured by connecting a plurality of kinds of capacitors in parallel. This makes it possible to generate a digital value on the basis of each of the capacitors connected in parallel.

Further, in the first aspect, the analog-to-digital converter may further include a comparator configured to successively compare a charge with which the first capacitor is charged and a charge with which the second capacitor is charged. This makes it possible to successively compare the charges held in the first and second capacitors to generate digital values.

Effects of the Invention

The present technology can have an excellent effect of suppressing power consumption of a time-to-digital converter used in a phase locked loop. Note that the effects described herein are not necessarily limited, and any of the effects described in the present disclosure may be obtained.

BRIEF DESCRIPTION OF DRAWINGS

FIGS. 5A and 5B illustrate an example of a mode of A/D conversion by a charge binary method in the T/D converter 100 in an embodiment of the present technology.

MODE FOR CARRYING OUT THE INVENTION

Hereinafter, modes for carrying out the present technology (hereinafter, referred to as "embodiments") will be described. Description will be made in the following order.

1. Embodiment
2. Modification example (example in which a switching frequency of a switched capacitor is matched with one cycle of phase detection)

1. Embodiment

[ADPLL]

Figure 1:
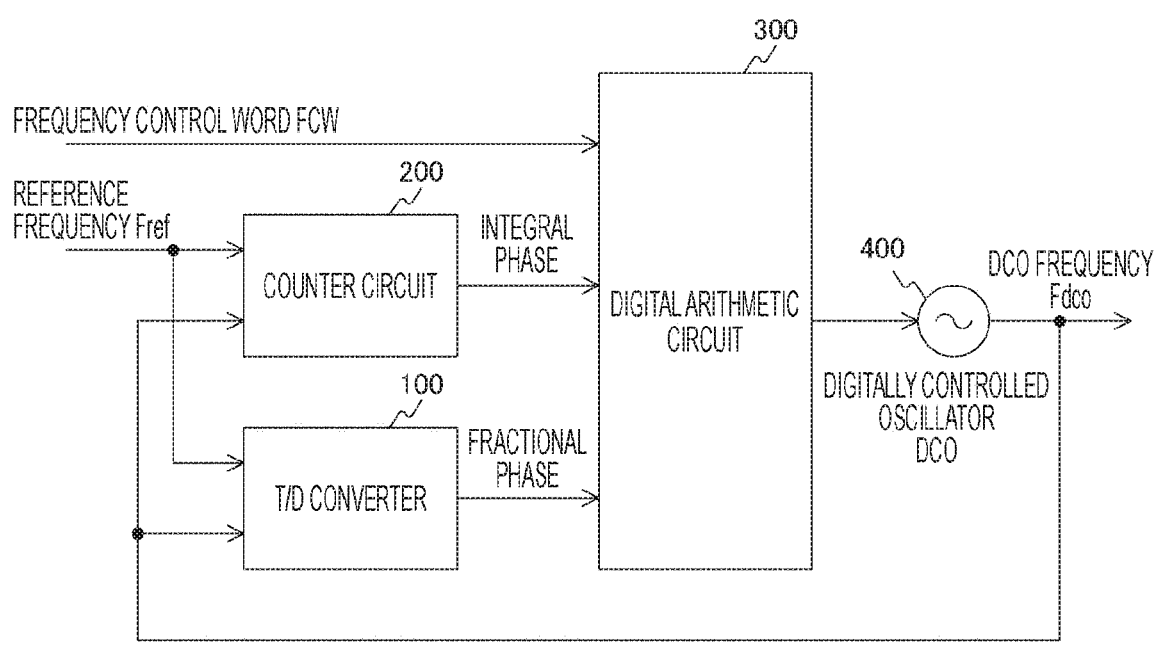
FIG. 1 illustrates an example of an overall configuration of a phase locked loop (ADPLL) in an embodiment of the present technology.

FIG. 1 illustrates an example of an overall configuration of a phase locked loop (ADPLL) in an embodiment of the present technology.

The ADPLL is a digitized phase locked loop. The ADPLL includes a T/D converter 100, a counter circuit 200, a digital arithmetic circuit 300, and a digitally controlled oscillator 400.

The counter circuit 200 is a circuit that detects an integral phase difference between a DCO frequency Fdco and a reference frequency Fref in the ADPLL. The DCO frequency Fdco is a frequency of the digitally controlled oscillator (DCO) 400. The reference frequency Fref is an externally provided reference frequency.

The T/D converter 100 is a time-to-digital converter (TDC) that detects a fractional phase difference between the DCO frequency Fdco and the reference frequency Fref in the ADPLL. Note that the T/D converter 100 is an example of a time-to-digital converter recited in the claims.

The digital arithmetic circuit 300 is a circuit that controls the digitally controlled oscillator 400 according to a frequency control word (FCW). The digital arithmetic circuit 300 performs predetermined digital arithmetic on the basis of the integral phase difference detected by the counter circuit 200 and the fractional phase difference detected by the T/D converter 100, thereby controlling the digitally controlled oscillator 400. Note that the digital arithmetic circuit 300 is an example of a control circuit recited in the claims.

The digitally controlled oscillator 400 is a digitally controlled oscillator (DCO) whose frequency is controllable by a digital signal. A signal generated by the digitally controlled oscillator 400 serves as output of the ADPLL and is fed back to the T/D converter 100 and the counter circuit 200. Note that the digitally controlled oscillator 400 is an example of an oscillator recited in the claims.

[T/D Converter]

Figure 2:
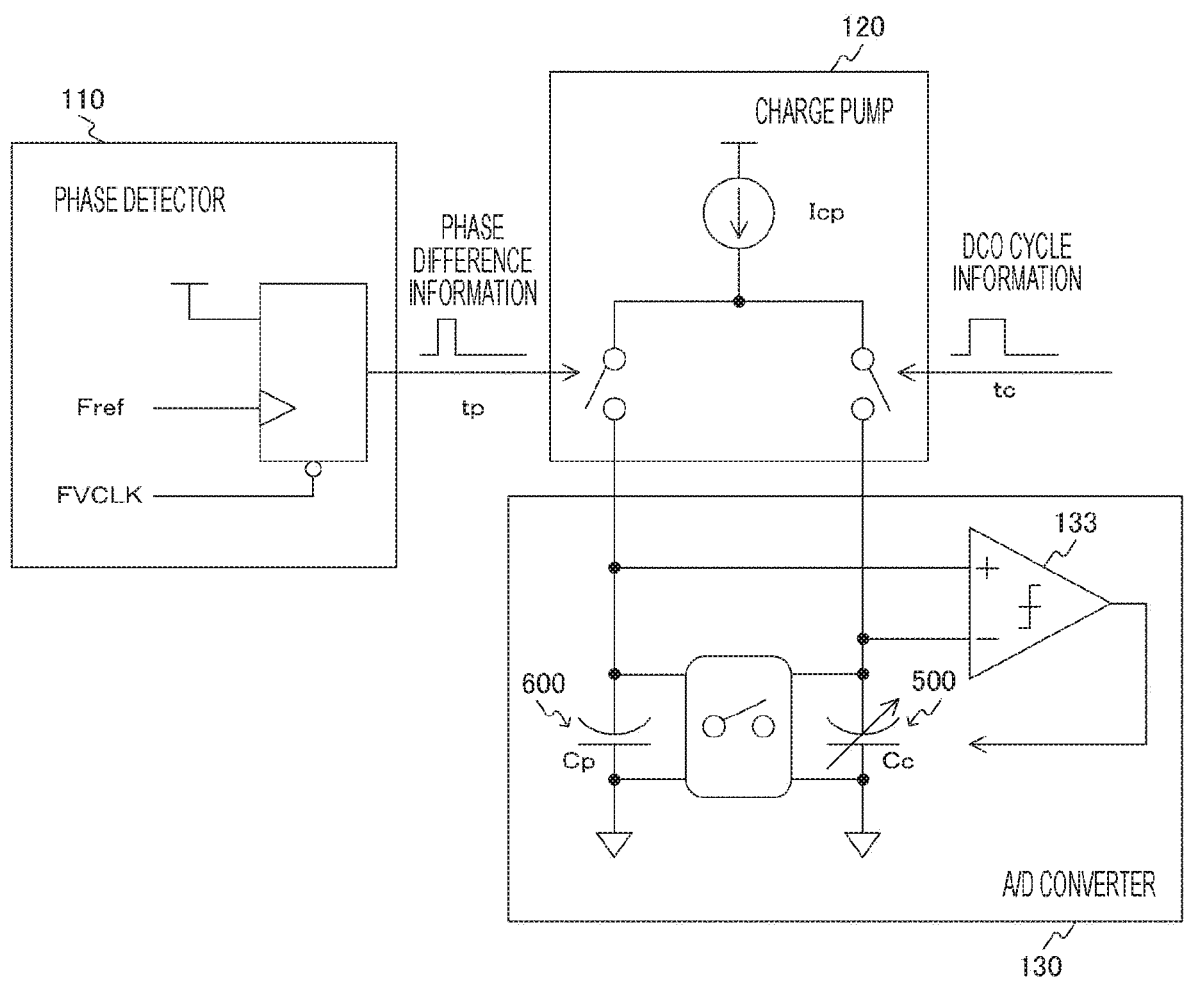
FIG. 2 illustrates an example of a conceptual configuration of a T/D converter 100 in an embodiment of the present technology.

FIG. 2 illustrates an example of a conceptual configuration of the T/D converter 100 in the embodiment of the present technology. Herein, FIG. 2 illustrates conceptual positioning of a phase detector 110, a charge pump 120, and an A/D converter 130 in the T/D converter 100. Note that examples of detailed configurations of the charge pump 120 and the A/D converter 130 will be described later.

The phase detector 110 generates phase difference information between the reference frequency Fref and a clock FVCLK of the digitally controlled oscillator 400. The phase difference information is a signal indicating the fractional phase difference between the DCO frequency Fdco and the reference frequency Fref, and a pulse width of the signal indicating the phase difference is denoted by tp.

The A/D converter 130 is an analog-to-digital converter (A/D converter) that generates a digital signal on the basis of a charge (analog quantity) with which a charge capacitor is charged. The A/D converter 130 includes two kinds of capacitors 500 and 600. The capacitor 500 is a capacitor Cc that holds a charge corresponding to DCO cycle information. Herein, the DCO cycle information is a signal indicating the integral phase difference detected by the counter circuit 200, and a pulse width for one cycle is denoted by tc. The capacitor 600 is a capacitor Cp that holds a charge corresponding to the phase difference information. The A/D converter 130 further includes a comparator 133. The comparator 133 successively converts the charges held in the capacitors 500 and 600 into digital values by a binary search. Note that the A/D converter 130 is an example of an analog-to-digital converter recited in the claims. Further, the capacitor 600 is an example of a first capacitor recited in the claims, and the capacitor 500 is an example of a second capacitor recited in the claims.

The charge pump 120 is a circuit that charges the capacitors 500 and 600 included in the A/D converter 130. The charge pump 120 includes a current source, supplies a current Icp to the A/D converter 130, and sequentially charges the capacitors 500 and 600. A time period in which the capacitor 500 is charged is a time period corresponding to the pulse width tc for one cycle of the DCO cycle information. A time period in which the capacitor 600 is charged is a time period corresponding to the pulse width tp of the phase difference information. Therefore, the capacitor 500 is charged with a charge corresponding to the pulse width tc for one cycle of the DCO cycle information, and the capacitor 600 is charged with a charge corresponding to the pulse width tp of the phase difference information. Note that the charge pump 120 is an example of a current source circuit recited in the claims.

[Current Source]

Figure 3:
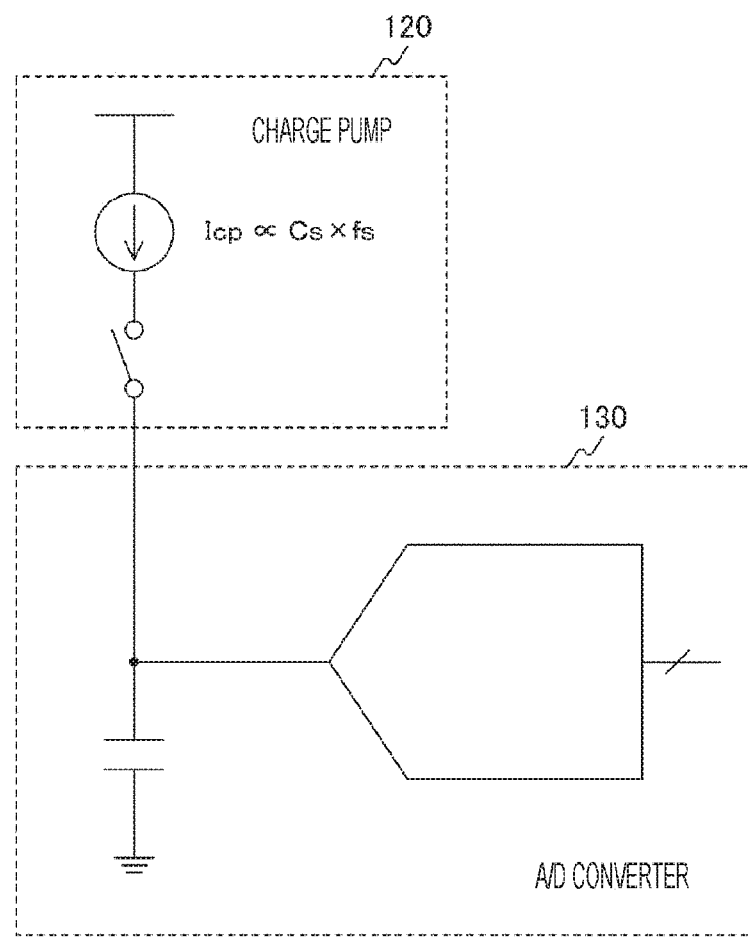
FIG. 3 illustrates an example of a conceptual configuration of a current source in the T/D converter 100 in an embodiment of the present technology.

FIG. 3 illustrates an example of a conceptual configuration of a current source in the T/D converter 100 in the embodiment of the present technology.

The T/D converter 100 supplies a current from the charge pump 120 to charge the capacitors 500 and 600 of the A/D converter 130 as described above. The charge pump 120 uses a switched capacitor resistance as a reference resistance of the current source. When a capacitor of the switched capacitor is denoted by Cs and a switching frequency is denoted by fs, the current Icp supplied from the charge pump 120 is proportional to Cs×fs. By using such a current, it is possible to suppress an influence of PVT variation and eliminate the need for calibration of the charge pump 120.

Figure 4:
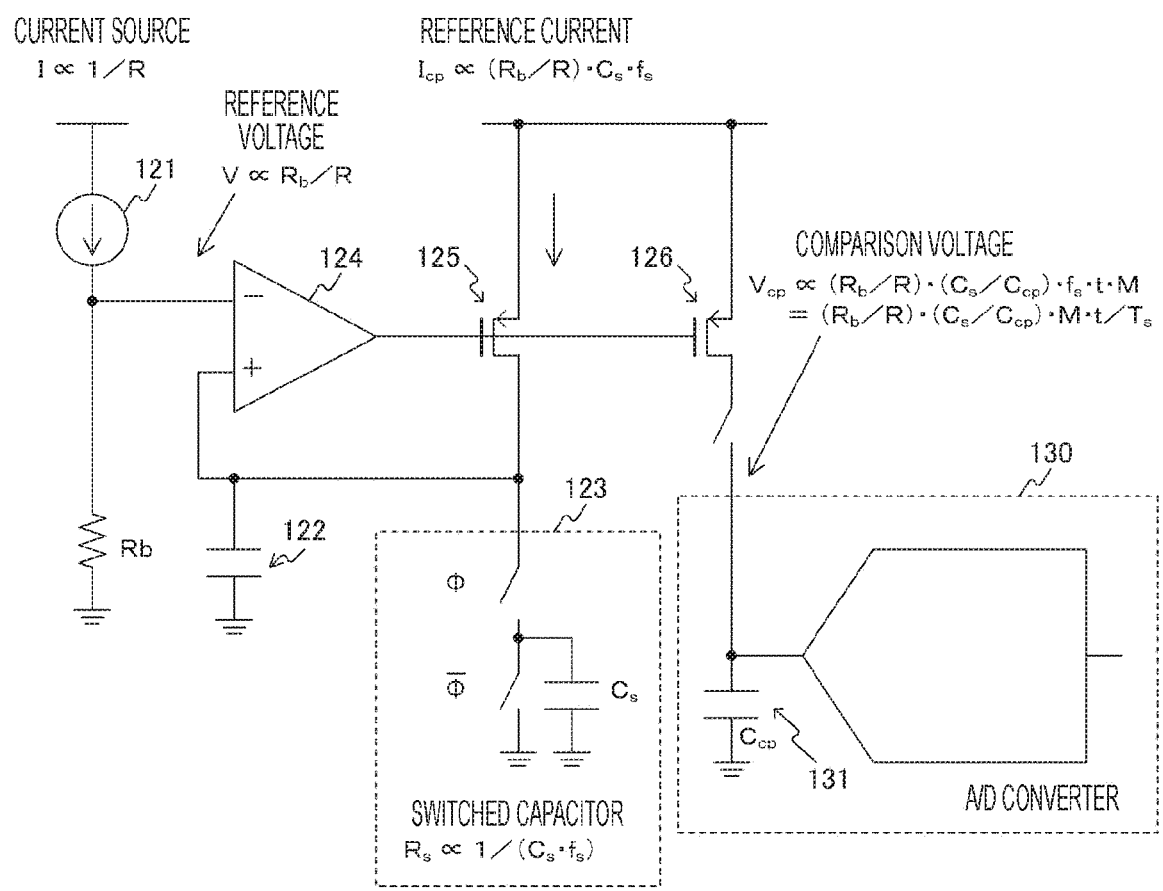
FIG. 4 illustrates an example of a configuration of a charge pump 120 in an embodiment of the present technology.

FIG. 4 illustrates an example of a configuration of the charge pump 120 in the embodiment of the present technology.

A current source 121 supplies a current I that is inversely proportional to an internal resistance R by a band gap reference (BGR) or the like to cause the current I to flow through a resistance Rb, thereby generating a reference voltage V. Herein, "Rb/R" is a fixed ratio, and thus the reference voltage V is a voltage that is proportional to "Rb/R" and does not depend on the PVT variation.

An operational amplifier 124 is an operational amplifier having an inverting input and a non-inverting input. The reference voltage V is input to the inverting input. A capacitor 122 and a switched capacitor 123 are connected to the non-inverting input. Although a large current cannot be extracted from the current source 121, a necessary current can be appropriately supplied by using the operational amplifier 124.

The switched capacitor 123 includes two switches that perform switching operations in different phases and a capacitor Cs. A resistance value Rs of the switched capacitor 123 is inversely proportional to Cs×fs. Therefore, a reference current Icp flowing through the switched capacitor 123 is given by the following expression.

Icp ∝ (Rb/R)×Cs×fs

Herein, "Rb/R" is a fixed ratio, and thus the reference current Icp is proportional to Cs×fs.

Transistors 125 and 126 are PMOS transistors forming a current mirror circuit. When a transistor size (channel width) of the transistor 126 is M times as large as that of the transistor 125, a current flowing through the transistor 126 is M times as much as that of the transistor 125. The current flowing through the transistor 126 is used to charge a capacitor 131 of the A/D converter 130.

Herein, when the capacitor 131 is denoted by Ccp, a voltage of the capacitor 131 (comparison voltage Vcp) is given by the following expression. Note that t denotes a charge time of the capacitor 131, and Ts denotes a charge time of the switched capacitor 123.

$$Vcp = (Icp/Ccp) \times t \times M \propto (Rb/R) \times (Cs/Ccp) \times fs \times t \times M = (Rb/R) \times (Cs/Ccp) \times M \times (t/Ts)$$

Therefore, as is clear from the above expression, the comparison voltage Vcp at the time of charging the capacitor 131 of the A/D converter 130 is proportional to a ratio of the charge time t of the capacitor 131 (Ccp) to the charge time Ts of the capacitor Cs of the switched capacitor 123. That is, the comparison voltage Vcp has a constant gradient with respect to the charge time t of the capacitor 131 (Ccp). Further, the comparison voltage Vcp is proportional to the ratio of the capacitor 131 (Ccp) of the A/D converter 130 to the capacitor Cs of the switched capacitor 123.

FIGS. 5A and 5B illustrate an example of a mode of A/D conversion by a charge binary method in the T/D converter 100 in the embodiment of the present technology.

A voltage binary method has been conventionally adopted to convert an analog quantity with which a capacitor is charged into a digital value. In the voltage binary method, a phase difference voltage Vph is converted by using a full-scale voltage VFS of the TDC as a yardstick. Therefore, when the full-scale voltage VFS fluctuates due to the PVT variation, a voltage corresponding to the phase difference voltage Vph changes.

Meanwhile, as illustrated in FIG. 5A, the embodiment of the present technology adopts a charge binary method of performing charge calculation by using a charge amount corresponding to a DCO cycle as a full scale. Therefore, even in a case where a capacitance value changes due to the PVT variation, the digital value does not change as illustrated in FIG. 5B if a charge ratio can be maintained because the charge amount is determined on the basis of a current value and time (Q=It=CV). Further, a charge voltage of the charge pump needs to be kept within a range that does not deteriorate linearity of the current source, and this point is secured in the embodiment of the present technology because the charge current is proportional to the capacitor as described above.

Note that, also in the voltage binary method, the full-scale voltage VFS can be configured by a voltage with which a charge pump charges a capacitor. However, in a case where successive conversion is performed by the voltage binary method, it is necessary to add an unnecessary buffer circuit to the charge pump because the full-scale voltage VFS needs to be driven with low impedance. Further, there is a non-ideal effect such as an offset of the buffer circuit, and thus correction is required. Regarding this point, in the embodiment of the present technology, successive approximation is performed at a ratio of a charged charge amount. This makes it possible to perform conversion into a digital value without an unnecessary non-ideal effect, and generally eliminate the need for normalization of an integral part and a fractional part in the ADPLL (matching one cycle of the fractional part with one cycle of the integral part).

Figure 6:
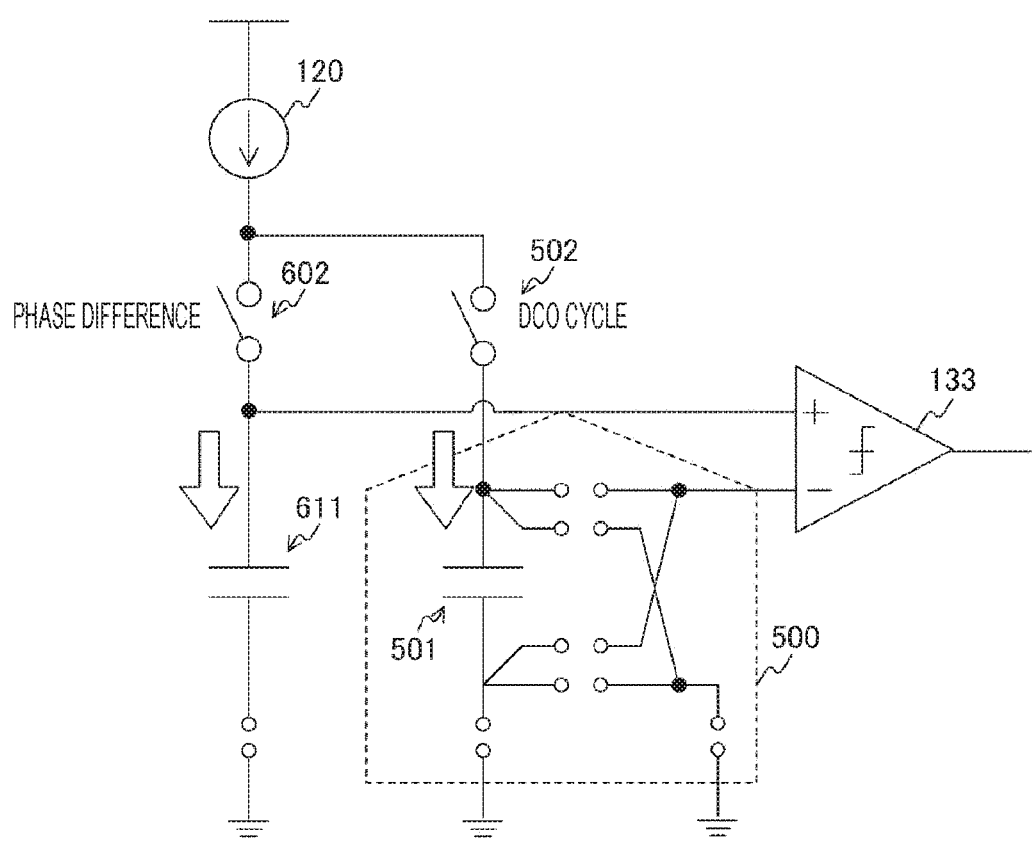
FIG. 6 illustrates an example of a conceptual configuration of A/D conversion in the T/D converter 100 in an embodiment of the present technology.

FIG. 6 illustrates an example of a conceptual configuration of A/D conversion in the T/D converter 100 in the embodiment of the present technology.

In this example, the capacitor 611 is charged with a charge corresponding to the phase difference information via a switch 602. Further, the capacitor 501 of the capacitor 500 is charged with a charge corresponding to the DCO cycle information via a switch 502. Because the embodiment of the present technology adopts the charge binary method as described above, charges in the capacitors 611 and 501 are compared by the comparator 133 and are converted into digital values.

Figure 7:
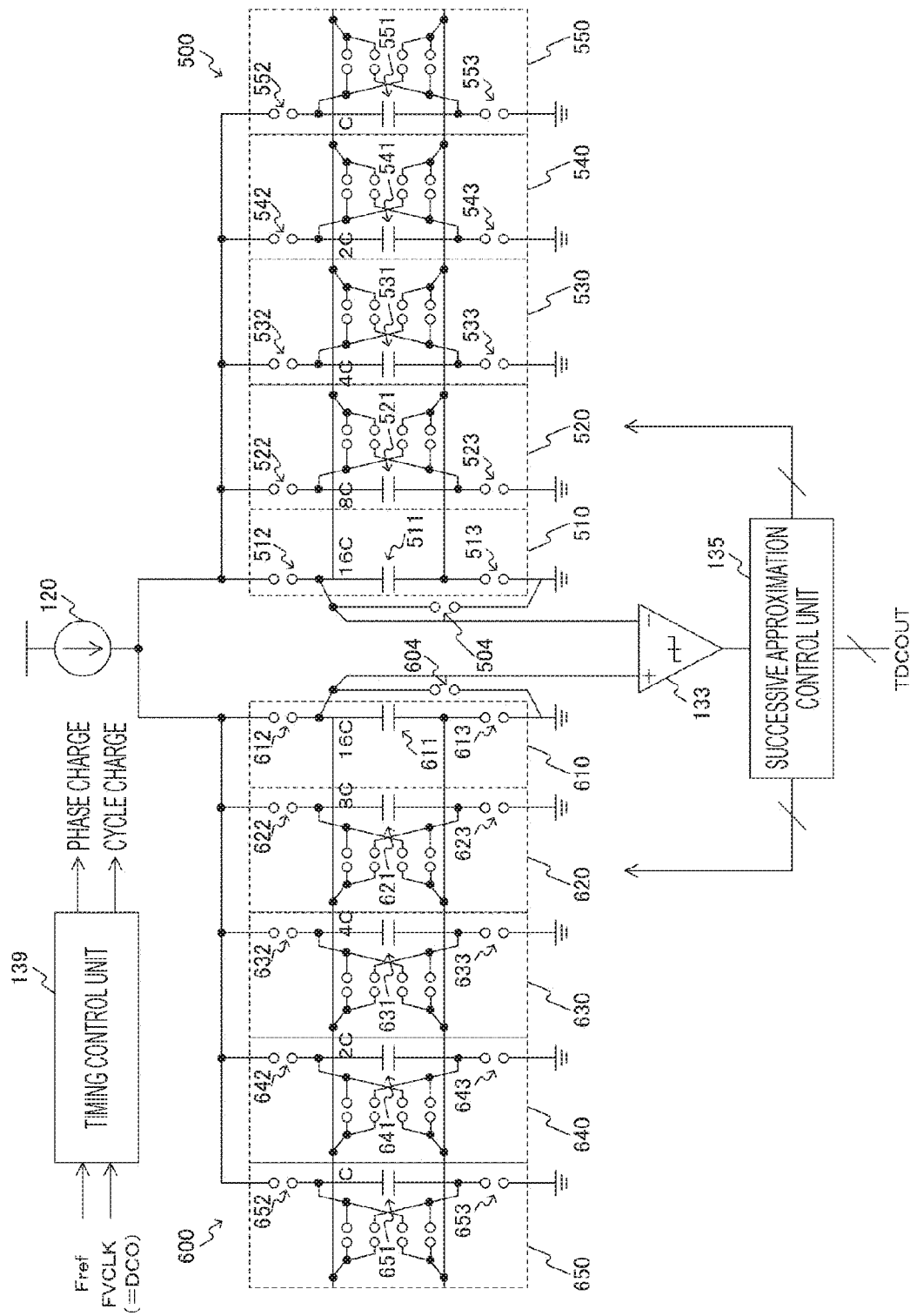
FIG. 7 illustrates an example of a configuration of an A/D converter 130 in the T/D converter 100 in an embodiment of the present technology.

FIG. 7 illustrates an example of a configuration of the A/D converter 130 in the T/D converter 100 in the embodiment of the present technology.

The A/D converter 130 includes the capacitors 500 and 600, the comparator 133, a successive approximation control unit 135, and a timing control unit 139.

The capacitor 500 is a capacitor that holds a charge corresponding to the DCO cycle information as described above. The capacitor 600 is a capacitor that holds a charge corresponding to the phase difference information as described above. The comparator 133 successively converts the charges held in the capacitors 500 and 600 into digital values by a binary search as described above.

The successive approximation control unit 135 controls successive conversion by controlling inter-capacitor switches in the respective capacitors 500 and 600 on the basis of a comparison result by the comparator 133.

The timing control unit 139 controls a charge timing for each of the capacitors 500 and 600 on the basis of the reference frequency Fref and the clock FVCLK of the digitally controlled oscillator 400. Note that the timing control unit 139 and switches controlled by the timing control unit 139 partially overlap the phase detector 110 and the charge pump 120 in the above description.

The capacitor 500 includes five blocks 510 to 550 each of which has a different capacitor. When a capacitor 551 included in the block 550 is denoted by C, a capacitor 511 of the block 510 is denoted by 16C, a capacitor 521 of the block 520 is denoted by 8C, a capacitor 531 of the block 530 is denoted by 4C, and a capacitor 541 of the block 540 is denoted by 2C. Switches 512 to 552 are connected between the capacitors 511 to 551, respectively, and the charge pump 120, and the capacitors 511 to 551 are charged when the switches 512 to 552 are turned on. Those switches 512 to 552 are controlled by the timing control unit 139. A time period in which the capacitors 511 to 551 are charged is a time period corresponding to one cycle of the DCO cycle information. Further, switches 513 to 553 are connected to the other side of the capacitors 511 to 551. Those switches are for adjusting the time constant, and are always connected. Further, a switch 504 is a switch for resetting the capacitors 511 to 551.

In the capacitor 500, the capacitors 511 to 551 are connected in parallel by inter-capacitor switches. Those inter-capacitor switches are switches for adding or subtracting charges with which the capacitors 511 to 551 are charged in successive conversion. When, among four vertically arranged switches, top switches and bottom switches are connected, the charges are added. Meanwhile, when second switches and third switches from the top are connected, the charges are subtracted. Details of control of the inter-capacitor switches will be described later.

The capacitor 600 includes five blocks 610 to 650 each of which has a different capacitor. When a capacitor 651 included in the block 650 is denoted by C, a capacitor 611 of the block 610 is denoted by 16C, a capacitor 621 of the block 620 is denoted by 8C, a capacitor 631 of the block 630 is denoted by 4C, and a capacitor 641 of the block 640 is denoted by 2C. Switches 612 to 652 are connected between the capacitors 611 to 651, respectively, and the charge pump 120. Those switches 612 to 652 are controlled by the timing control unit 139. The capacitor 611 is charged when the switch 612 is turned on. A time period in which the capacitor 611 is charged is a time period corresponding to the phase difference information. Meanwhile, the capacitors 621 to 651 are provided to match the number of capacitors in order to match gain when charges are converted into voltage, and the charges are always zero. Further, switches 613 to 653 are connected to the other side of the capacitors 611 to 651. The switches are for adjusting the time constant, and are always connected. Further, a switch 604 is a switch for resetting the capacitors 611 to 651.

In the capacitor 600, the capacitors 611 to 651 are connected by inter-capacitor switches. Those inter-capacitor switches are controlled in a similar manner to the capacitor 500 in successive conversion. However, the charges in the capacitors 621 to 651 are always zero, and thus no charge moves.

Figure 8:
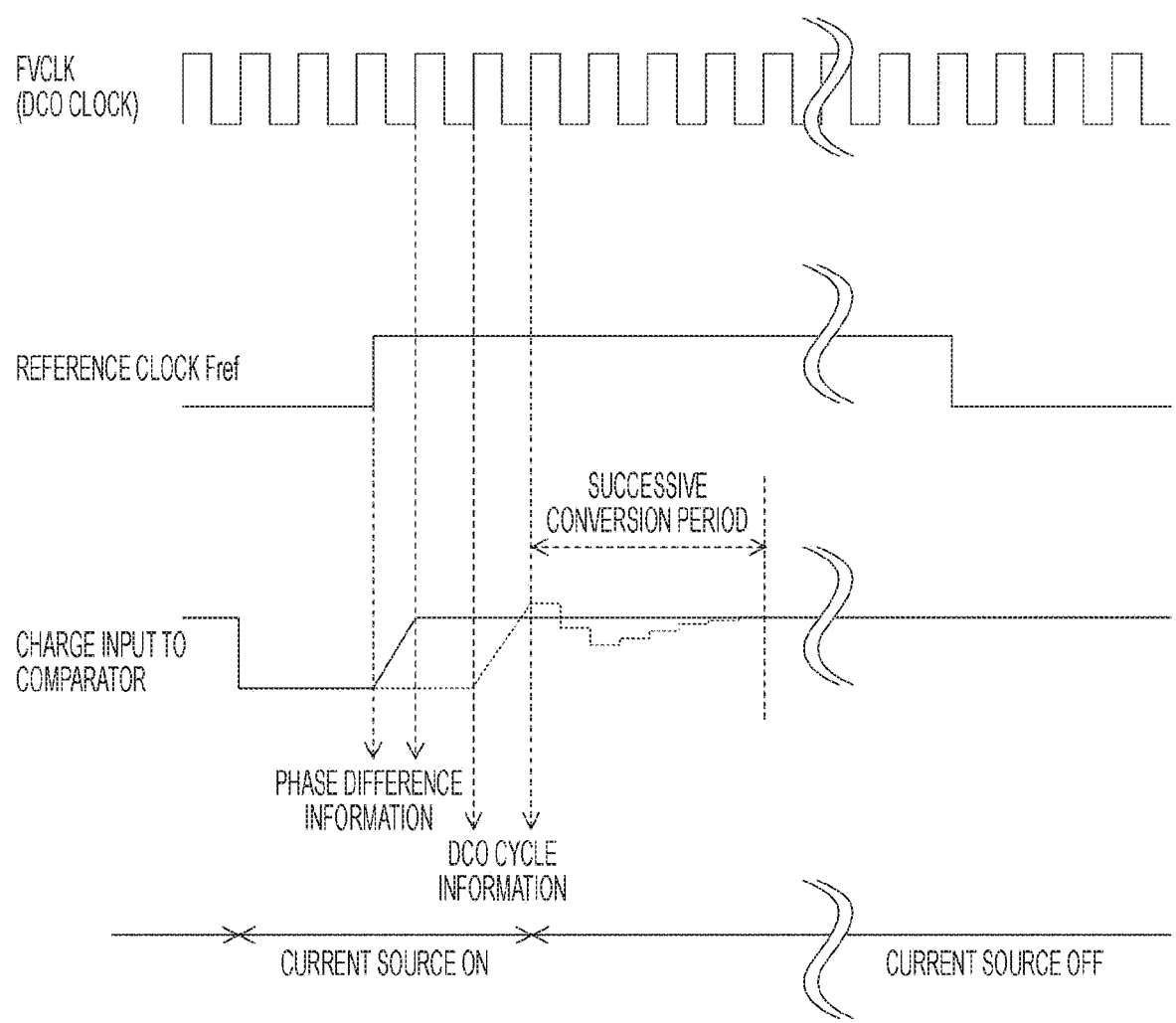
FIG. 8 is a timing chart showing an example of operation of the A/D converter 130 in the T/D converter 100 in an embodiment of the present technology.

FIG. 8 is a timing chart showing an example of operation of the A/D converter 130 in the T/D converter 100 in the embodiment of the present technology.

When the reference clock Fref rises, the capacitor 600 (capacitor 611) is charged with a charge for a time period corresponding to the phase difference information, and a corresponding voltage is input to one end of the comparator 133. Further, the capacitor 500 (capacitors 511 to 551) is charged with a charge in a time period corresponding to one cycle of the DCO cycle information, and a corresponding voltage is input to the other end of the comparator 133. Note that FIG. 8 shows a waveform in the unit of charge as an input of the comparator 133.

When charging the capacitors 600 and 500 is completed, supply of a current from the charge pump 120 is turned off, and the comparator 133 compares charge amounts of the both in a successive conversion period. At this time, first, the capacitor 611 and the capacitor 511 in 16C are compared. Then, based on a result thereof, the capacitor 621 and the capacitor 521 in 8C are connected by the inter-capacitor switches, respectively. Therefore, charges are added or subtracted, and, as a result, the charge amounts are compared by the comparator 133. Then, based on a result thereof, the capacitor 631 and the capacitor 531 in 4C are connected by the inter-capacitor switches, respectively. Therefore, charges are added or subtracted, and, as a result, the charge amounts are compared by the comparator 133. Then, based on a result thereof, the capacitor 641 and the capacitor 541 in 2C are connected by the inter-capacitor switches, respectively. Therefore, charges are added or subtracted, and, as a result, the charge amounts are compared by the comparator 133. Then, based on a result thereof, the capacitor 651 and the capacitor 551 in C are connected by the inter-capacitor switches, respectively. Therefore, charges are added or subtracted, and, as a result, the charge amounts are compared by the comparator 133.

In this example, it is supposed that the charge amounts in "16C" are firstly compared, and then, "16−8C," "16C−8C−4C," "16C−8C−4C+2C," and "16C−8C−4C+2C+C" are successively compared.

As described above, according to the embodiment of the present technology, it is possible to suppress the influence of the PVT variation and eliminate the need for calibration of the charge pump 120 by using the reference current Icp that is proportional to Cs×fs as the current source of the charge pump 120. Further, it is possible to generate a digital value without depending on fluctuation of the phase difference voltage by adopting the charge binary method in the A/D converter 130. That is, this makes it possible to suppress power consumption of the T/D converter 100.

2. Modification Example

Figure 9:
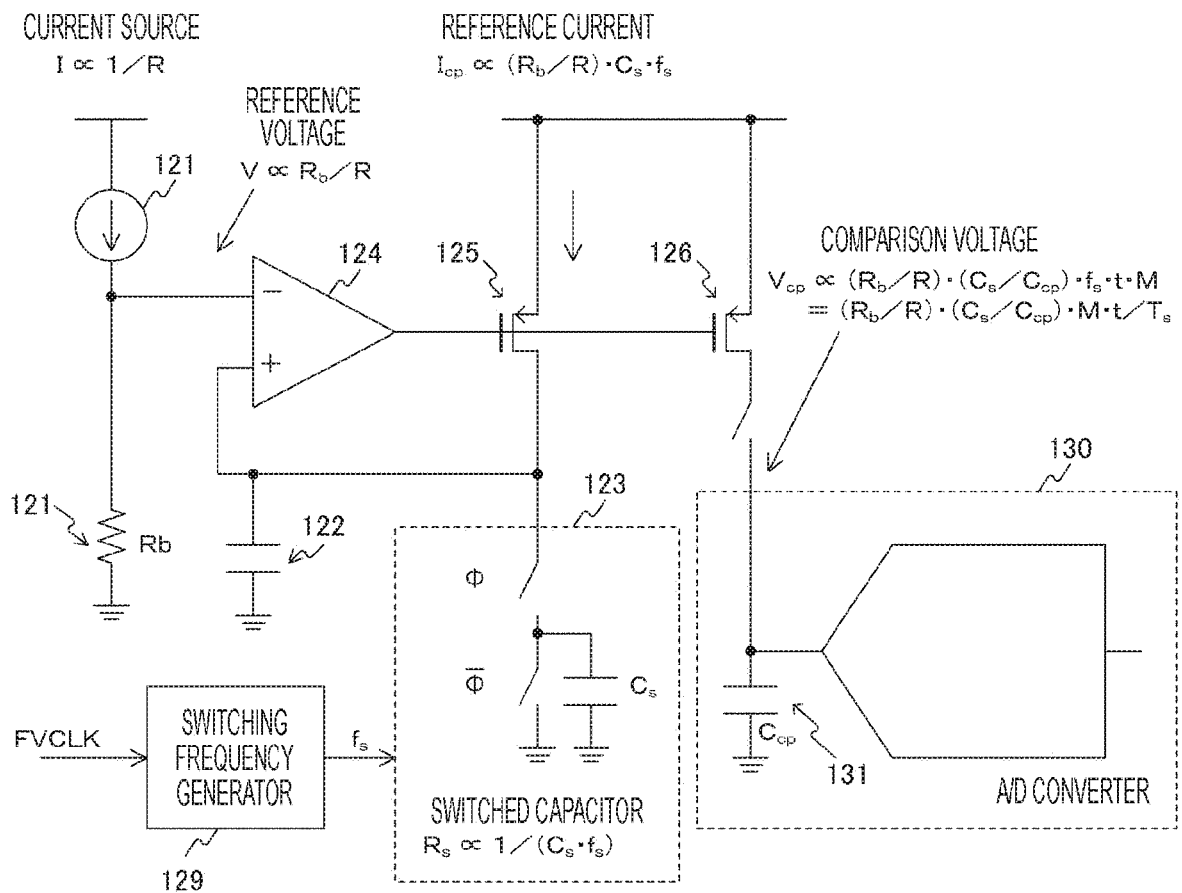
FIG. 9 illustrates an example of a configuration of the charge pump 120 in a modification example of an embodiment of the present technology.

FIG. 9 illustrates an example of a configuration of the charge pump 120 in a modification example of the embodiment of the present technology.

In this modification example, a switching frequency generator 129 is further provided in addition to the charge pump 120 according to the above embodiment. The switching frequency generator 129 generates a switching frequency fs of the switched capacitor 123. The switching frequency generator 129 generates the switching frequency fs so as to match the clock FVCLK of the digitally controlled oscillator 400. This makes it possible to keep the dynamic range constant, use a single time-to-digital converter TDC in various frequency ranges of the digitally controlled oscillator DCO, and support a wide range of basic frequencies Fref.

Note that the above-described embodiment shows an example for embodying the present technology, and the matters in the embodiment and the matters specifying the invention in the claims have a corresponding relationship. Similarly, each matter specifying the invention in the claims and each matter in the embodiment of the present technology having the same name have a corresponding relationship. However, the present technology is not limited to the embodiment, and can be embodied by making various modifications to the embodiment without departing from the scope of the present technology.

Further, the processing procedures described in the above embodiment may be regarded as a method having a series of the above procedures, or may be regarded as a program for causing a computer to execute the series of procedures or a recording medium storing the program. The recording medium can be, for example, a compact disc (CD), a MiniDisc (MD), a digital versatile disc (DVD), a memory card, a Blu-ray (registered trademark) disc, or the like.

Note that the effects described in the present specification are merely illustrative and are not limited. Further, additional effects may be obtained.

Note that the present technology can also have the following configurations.

(1) A time-to-digital converter including:
an analog-to-digital converter including a predetermined charge capacitor; and
a current source circuit configured to supply a charge current that charges the charge capacitor with a charge, in which
a charge voltage of the charge capacitor has a constant gradient with respect to a charge time.

(2) The time-to-digital converter according to (1), in which:
the current source circuit supplies the charge current by using a resistance of a switched capacitor as a reference resistance; and
the charge current is proportional to a capacitor and a switching frequency of the switched capacitor.

(3) The time-to-digital converter according to (2), in which
the charge voltage is proportional to a ratio of the charge capacitor to the capacitor of the switched capacitor.

(4) The time-to-digital converter according to (2) or (3), in which
the current source circuit matches the switching frequency of the switched capacitor with one cycle of phase detection.

(5) The time-to-digital converter according to any one of (1) to (4), in which
the analog-to-digital converter includes, as the charge capacitor, a first capacitor configured to hold phase information and a second capacitor configured to hold cycle information.

(6) The time-to-digital converter according to (5), in which
the first capacitor is configured by connecting a plurality of kinds of capacitors in parallel.

(7) The time-to-digital converter according to (5) or (6), in which
the analog-to-digital converter further includes a comparator configured to successively compare a charge with which the first capacitor is charged and a charge with which the second capacitor is charged.

(8) A phase locked loop including:
an oscillator configured to output a signal having a predetermined frequency;
a counter circuit configured to generate an integral phase;
a time-to-digital converter configured to generate a fractional phase; and
a control circuit configured to control the oscillator on the basis of the integral phase and the fractional phase, in which
the time-to-digital converter includes an analog-to-digital converter including a predetermined charge capacitor, and a current source circuit configured to supply a charge current that charges the charge capacitor with a charge, in which a charge voltage of the charge capacitor has a constant gradient with respect to a charge time.

REFERENCE SIGNS LIST

100 T/D converter
110 Phase detector
120 Charge pump
121 Current source
122 Capacitor
123 Switched capacitor
124 Operational amplifier
125, 126 PMOS transistor
129 Switching frequency generator
130 A/D converter
131 Capacitor (Ccp)
133 Comparator
135 Successive approximation control unit
139 Timing control unit
200 Counter circuit
300 Digital arithmetic circuit
400 Digitally controlled oscillator
500 Capacitor (Cc)
600 Capacitor (Cp)

The invention claimed is:

1. A time-to-digital converter, comprising:
a phase detector configured to generate phase difference information that indicates a fractional phase difference between a first frequency and a second frequency;
an analog-to-digital converter including:
a first capacitor configured to hold a first charge corresponding to the phase difference information; and
a second capacitor configured to hold a second charge corresponding to oscillator cycle information, wherein the oscillator cycle information indicates an integral phase difference between the first frequency and the second frequency; and
a charge pump configured to supply a charge current to charge each of the first capacitor and the second capacitor, wherein a charge voltage corresponding to the first capacitor has a constant gradient with respect to a charge time.

2. The time-to-digital converter according to claim 1, wherein:
the charge pump is further configured to supply the charge current based on a resistance of a switched capacitor, the resistance of the switched capacitor is a reference resistance of the charge pump, and the charge current is proportional to a capacitor of the switched capacitor and a switching frequency of the switched capacitor.

3. The time-to-digital converter according to claim 2, wherein the charge voltage is proportional to a ratio of the first capacitor to the capacitor of the switched capacitor.

4. The time-to-digital converter according to claim 2, wherein the charge pump is further configured to match the switching frequency of the switched capacitor with one cycle of phase detection.

5. The time-to-digital converter according to claim 1, wherein the second capacitor corresponds to a plurality of capacitors, and a third capacitor of the plurality of capacitors is connected in parallel with a fourth capacitor of the plurality of capacitors.

6. The time-to-digital converter according to claim 1, wherein the analog-to-digital converter further includes a comparator configured to:

successively compare the first charge with the second charge; and generate digital values based on a result of the comparison of the first charge with the second charge.

7. A phase locked loop, comprising:

an oscillator configured to output a signal having a first frequency;

a counter circuit configured to detect an integral phase difference between the first frequency and a second frequency;

a time-to-digital converter including:

a phase detector configured to:

detect a fractional phase difference between the first frequency and the second frequency; and generate phase difference information based on the fractional phase difference between the first frequency and the second frequency;

an analog-to-digital converter including:

a first capacitor configured to hold a first charge corresponding to the phase difference information;

a second capacitor configured to hold a second charge corresponding to oscillator cycle information, wherein the oscillator cycle information corresponds to the integral phase difference between the first frequency and the second frequency; and a comparator configured to convert each of the first charge and the second charge into corresponding digital values;

a charge pump configured to supply a charge current to charge each of the first capacitor and the second capacitor, wherein a charge voltage corresponding to the first capacitor has a constant gradient with respect to a charge time; and a digital arithmetic circuit configured to control the oscillator based on the integral phase difference and the fractional phase difference.

* * * * *